United States Patent [19]
Mori et al.

[11] Patent Number: 5,535,149
[45] Date of Patent: Jul. 9, 1996

[54] DUPLEX ADAPTIVE DIGITAL FILTER AND METHOD OF OPERATION

[75] Inventors: Shinsaku Mori, 1-31-6, Okuzawa, Setagaya-ku, Tokyo; Iwao Sasase, 2-20-32-602, Minowamachi, Kouhoku-ku, Yokohama-shi, Kanagawa-ken; Kiyoshi Takahashi, Tokyo, all of Japan

[73] Assignees: Shinsaku Mori, Tokyo; Iwao Sasase, Yokohamu; TEAC Corporation, Tokyo, all of Japan

[21] Appl. No.: 262,478

[22] Filed: Jun. 20, 1994

[30] Foreign Application Priority Data

Dec. 21, 1993 [JP] Japan .................................. 5-345224

[51] Int. Cl.⁶ .............................. G06F 17/00; H04J 1/00; H04J 3/00; H04M 1/00
[52] U.S. Cl. .................................. 364/724.19; 370/32.1; 379/411
[58] Field of Search ...................... 364/724.19, 724.16; 370/32, 32.1; 379/406, 410, 411; 455/305, 306; 327/552

[56] References Cited

U.S. PATENT DOCUMENTS

| | | | |
|---|---|---|---|
| 3,860,768 | 1/1975 | Wehrmann | 379/410 |
| 4,021,623 | 5/1977 | Suyderhoud et al. | 379/411 |
| 4,232,400 | 11/1980 | Yamamoto et al. | 455/305 |
| 4,479,036 | 10/1984 | Yamamoto et al. | 379/410 |
| 5,237,562 | 9/1993 | Fujii et al. | 370/32.1 |
| 5,247,512 | 9/1993 | Sugaya et al. | 370/32.1 |
| 5,263,020 | 11/1993 | Yatsuzuka et al. | 370/32.1 |
| 5,315,585 | 5/1994 | Iizuka et al. | 370/32.1 |

OTHER PUBLICATIONS

Yamamoto et al., An Adaptive Echo Canceller with Variable Step Gain Method; The Transactions of the IECE of Japan, vol. E 65, No. 1, Jan. 1982.

Fujii et al., Optimum Adjustment of Step Gain in Learning Indentification Algorith; The Transactions of the Institute of Electronics, Information and Communication Engineers; vol. J75–A; No. 6; Jun. 1992.

Claasen et al., Comparison of the Convergence of Two Algorithms for Adaptive FIR Digital Filers; IEEE Transactions on Acoustics, Speech, and Signal Processing; vol. ASSP-29, No. 3, Jun. 1981.

Mori et al.; Proposal of Noise Level Estimation Method for Improvement of Initial convergence Characteristics and Variable Step Gain Algorithm; collection of papers of Sumulation–Technology conference of twelve; Published Jun. 23, 1993; pp. 257–260.

Primary Examiner—Roy N. Envall, Jr.
Assistant Examiner—Emmanuel L. Moise
Attorney, Agent, or Firm—Woodcock Washburn Kurtz Mackeiwicz & Norris

[57] ABSTRACT

An adaptive filter system has a first and a second filter subsystem of like construction, each having a series of delay elements for imparting a unit delay of one sampling interval to successive input samples in order to concurrently obtain a set of input samples of different sampling times. Each set of input samples are multiplied by respective coefficients, and the resulting values are added together for comparison with a reference signal. The coefficients are updated for each new set of input samples. For such updating, the first subsystem uses the step gain that is fixed at one, whereas the step gain used by the second subsystem is varied with time for faster convergence and smaller convergence error.

7 Claims, 13 Drawing Sheets

DUPLEX ADAPTIVE DIGITAL FILTER AND METHOD OF OPERATION

BACKGROUND OF THE INVENTION

This invention relates to an adaptive filter, which is a type of digital filter used for echo cancellation and noise cancellation, among other purposes, and to a method of controlling its operation.

A typical prior art adaptive filter is sketched in FIG. 1 of the attached drawings which is intended for the modeling of an unknown dynamic system. Samples of an input signal or data x(t) are sent at predetermined sampling intervals over an input line 1 to an unknown system 2 which is shown to comprise a secondary delay element 3, noise source 4, and adder 5. The output d(t) from this unknown system 2, which is used as a reference signal, is therefore the addition of the output from the delay element 3 and the noise from its source 4.

The input line 1 is also connected to a transversal filter unit 6, known also as a finite impulse response filter, comprising a series of (N–1) delay elements 7–9. Only three delay elements are shown here for illustrative convenience, with the understanding that N=4. Actually, however, N may be as great as, say, 1024. Each of the delay elements 7–9 imparts a unit delay of one sampling interval to the input data samples x(t). Accordingly, N input data samples x(t), x(t–1), x(t–2) and x(t–3) of different sampling times are obtained concurrently on N lines 10–13, respectively, which are connected respectively to the input line 1 and to the outputs of the (N–1) delay elements 7–9. N coefficient multipliers 14–17 multiply the input data samples x(t)–x(t–3) by respective coefficients $w_0$–$w_3$. The resulting outputs from the multipliers 14–17 are all directed into an adder 18 thereby to be added together into an output y(t). This output y(t) is sent to a subtracter or difference detector 20, which produces a difference signal e(t) representative of the difference between the adder output y(t) and the reference signal d(t).

The coefficients $w_0$–$w_3$ must be updated for each sampling interval. To this end the multipliers 14–17 are all connected to a coefficient updater 19, to which there are also connected the tap lines 10–13 of the transversal filter unit 6 and the output of the subtracter 20.

The output y(t) from the adder 18 can be expressed as $$y(t) = w_o(t)x(t) + w_1(t)x(t-1) + w_2(t)x(t-2) + w_3(t)x(t-3)$$

or, more generally, in devices having N multipliers, $$y(t) = w_o(t)x(t) + w_1(t)x(t-1) \ldots W_{N-1}(t)x(t-N+1) \quad (1)$$

where (t-N+1) stands for [t-(N-1)]

The output e(t) from the subtracter 20 is given by $$e(t) = d(t) - y(t) \quad (2)$$

The coefficients $w_0$–$w_3$ or $w_0$–$w_{N-1}$ of the transversal filter unit 6 are so controlled as to minimize the difference signal e(t). In use of the FIG. 1 device for echo cancellation the filter 6 replicates the echo, and the replica y(t) thereby produced is used for canceling out the echo in the output d(t) from the unknown system 2 by the subtracter 20.

A typical algorithm employed for updating the coefficients is that known as normalized least mean square (NLMS) or learning identification method. The NLMS algorithm updates coefficients according to the equation $$W(t+1) = W(t) + [Ke(t)/\|X(t)\|^2]X(t) \quad 3)$$

where
W(t+1)=vectors of N updated coefficients
W(t)=vectors of N coefficients $w_0(t)$, $w_1(t)$, ... $w_{N-1}(t)$ before being updated; it can be rewritten, using the symbol T standing for the transpose of a matrix, as $$W(t) = [w_o(t), w_1(t), w_2(t), \ldots W_{N-1}(t)]^T$$

X(t)=vectors of N input samples x(t), w(t–1), ... x(t–N+1) of different sampling moments, rewritable as
$X(t) = [x(t), x(t-1), \ldots x(t-N+1)]^T$ $\|X(t)\|^2$=inner product of X(t)
e(t)=difference signal obtained from subtracter 20, rewritable as $$e(t) = \epsilon(t) + n(t)$$

where n(t) is the noise under observation, and $\epsilon(t)$ is the noise-free difference signal expressed as $\epsilon(t) = [H-W(t)]^T X(t)$ where H is the coefficient of the unknown system 2
K=parameter known as step gain.

In short the NLMS algorithm as expressed by Expression (3) is such that each updated set of coefficients are obtained by adding the previous set of coefficients to the product of the vectors X(t) of the input samples x(t)–x(t-N+1) and the difference signal e(t) divided by the inner product of the input sample vectors.

The difference signal e(t) becomes closer and closer to an absolute minimum with the repetition of the updating of the coefficients. This convergence depends to a large extent upon the step gain K, which is greater than zero and not more than one. The greater the step gain, the higher will be the speed of convergence, but the greater will be the estimation error $\epsilon(t)$, and vice versa. The step gain was fixed, not varied with time, in the original NLMS algorithm, so that faster convergence and smaller convergence error represented objectives that were contradictory to each other.

An improvement of the original NLMS algorithm is suggested by the article entitled "An adaptive Echo Canceler with Variable Step Gain Method" by Seiichi Yamamoto et al. in the Volume E65, Number 1 issue of *The Transactions of the Institute of Electronics and Communication Engineers of Japan* published in January 1982 by the Institute of Electronics and Communication Engineers of Japan. Essentially, the echo canceler of Yamsmoro et al. is a combination of two adaptive filters. FIG. 2 depicts an adaptation of the Yamamoto et al. duplex echo canceler to the modeling of an unknown system. The duplex adaptive filter system shown enclosed in the dashed outline in this figure can be thought of as comprising a first 21 and a second 21' adaptive filter subsystem, even though the complete system is typically fabricated as a single digital signal processor. Each subsystem 21 or 21' comprises the transversal filter unit 6 or 6', respectively the coefficient updater 19 or 19', respectively and the subtracter 20 or 20', respectively which can all be of the same constructions and the same interconnections as their counterparts in the FIG. 1 system.

The only difference between the two subsystems 21 and 21' is the step gain computer 23 included in the second subsystem 21'. Inputting the difference signals $e_1(t)$ and $e_2(t)$ from the subtracters 20 and 20' of both subsystems 21 and 21', the step gain computer 23 outputs a step gain that varies with time, for application to the coefficient updater 19' of the second subsystem. In the first subsystem 21, on the other hand, the step gain is fixed at one, so that the coefficients are updated by the original NLMS method. Since the first subsystem 21 is faster in convergence than the second 21', the noise n(t) is estimated from the difference signal e(t) of the first subsystem, and based on this estimation the variable step gain of the second subsystem is controlled.

Let $K_2(t)$ be the step gain of the second filter subsystem 21'. Then $$K_2(t)=[\delta_{e2}'^2(t)- \delta_n'^2(t)]/\delta_{e2}'^2(t) \qquad (4)$$

where $\delta_{e2}'(t)$=mean value of the difference signal $e_2(t)$ from the subtracter 20' of the second subsystem 21'

$\delta_n'^2(t)$=mean value of the noise n(t), rewritable as $$\delta_n'^2(t)=0.5\ \delta_{e1}'^2(t) \qquad (5)$$

where $\delta_{e1}'^2(t)$ is the mean value of the difference signal $e_1(t)$ of the first filter subsystem 21.

The step gain computer 23 of the FIG. 2 prior art system, computing the step gain according to Expressions (4) and (5), may be configured as diagramed in FIG. 3. At block 31 is computed the mean value $\delta_{e1}'^2(t)$ of the difference signal $e_1(t)$ from the subtracter 20, FIG. 2, of the first filter subsystem 21. The mean value is then multiplied by 0.5 at block 32 to obtain $\delta_n'^2(t)$ of Expression (5). Block 33 indicates a smoothing lowpass filter, comprising a delay element 33a for each sample, a parameter $\alpha$ multiplier 33b, a (1-$\alpha$) multiplier 33c, and an adder 33d. The parameter $\alpha$ is a value between zero and one.

At block 34 is computed the mean value $\delta_{e2}'^2$, in Expression (4), of the difference signal $e_2(t)$ from the subtracter 20' of the second filter subsystem 21'. A subtracter 35 performs the subtraction for the numerator of Expression (4), and a divider 36 the division of the same equation. The output from the divider 36 is therefore the step gain $K_2(t)$ as defined by Expression (4). If the difference signals $e_1(t)$ and $e_2(t)$ vary with time, so does the step gain, $K_2(t)$.

FIG. 4 is a detailed illustration of each of the blocks 31 and 34 of the FIG. 3 step gain computer 23. Included is a squaring circuit 41 which squares the difference signal $e_1(t)$ or $e_2(t)$. The output of the squaring circuit 41 is connected to a delay line 42 having (L-1) delay elements or memories $Z^{-1}$ for providing L differently delayed outputs on taps connected to an adder 43. The output from the adder 43 is multiplied by 1/L by a multiplier 44.

The coefficient updaters 19 and 19' of the FIG. 2 prior art system, which make the computations of Expression (3) according to the NLMS algorithm, can each be of the FIG. 5 configuration. Each such means comprises a step gain K multiplier 50, a divider 51, an adder 52, four squaring circuits 53–56, four multipliers 57–60, four adders 61–64, and four coefficient storage means 65–68. The four updated coefficients $w_0$–$w_3$ can be obtained as the inputs e(t), x(t), x(t–1), x(t–2) and x(t–3) are supplied at predetermined sampling intervals. The two coefficient updaters 19 and 19' differ, however, in that the step gain K multiplier 50 receives the first step gain $K_1$ which is fixed at one in the first filter subsystem 21, while in the second subsystem 21' the second step gain $K_2(t)$ is varied with time, as has been set forth with particular reference to FIG. 3.

Let us consider how the FIG. 2 prior art system converges, assuming that the mean noise level is approximately constant. Initially, when the coefficients are set at suitable values, preferably zero, the estimation error is very large, and so is $\delta_{e2}'^2(t)$ in Expression (4). Consequently, the second step gain $K_2(t)$ is close to one, meaning a high converging speed. The mean value of the estimation errors will grow smaller with the repetition of coefficient updating. As the numerator of the right side of Expression (4) thus become less in value, so will the second step gain $K_2(t)$. The mean value of the estimation errors $\epsilon(t)$ will be infinitely close to that of the noise n(t) in the final state of convergence, and the second step gain $K_2(t)$ will be very close to zero but never go negative because the estimation error increases with a change in noise level.

The foregoing discussion of convergence holds true, however, only when the noise level is more or less constant. Actually, the mean noise value is computed from the difference signal $e_1(t)$ of the first subsystem 21 in which the step gain $K_1$ is fixed at one and which has a large initial estimation error. The mean noise level as initially computed from the difference signal of the first subsystem is therefore much greater than the true mean noise level, so that the second step gain $K_2(t)$ is significantly less than one. Thus the FIG. 2 prior art system was subject to delay in convergence.

Another modification of the NLMS algorithm, also suggesting a variable step gain, is proposed by Kensaku Fujii et al. in the article "Optimum Adjustment of Step Gain in Learning Identification Algorithm" in the Vol. J75-A, No. 6 issue of *The Transactions of the Institute of Electronics, Information and Communication Engineers* published in June 1992 by the Institute of Electronics, Information and Communication Engineers. Fujii et al. suggests to overcome delay in convergence during the initial period by adjustably varying the second step gain $K_2(t)$. However, this prior art method is based on the assumption that the system noise is only "white", so that it is unapplicable to variable noise systems.

SUMMARY OF THE INVENTION

The present invention seeks to speed the convergence of an adaptive filter system in the face of variations in noise level and of the unexpected behavior of the unknown system.

Briefly, the invention is directed to a duplex adaptive digital filter system of the type suggested by Yamamoto et al. The filter system has: (a) first input means for receiving samples of an input signal at predetermined sampling intervals; (b) second input means for receiving samples of a reference signal, associated with the input signal, at the predetermined sampling intervals; (c) a first filter subsystem for imparting a unit delay of one predetermined sampling interval to the successive input signal samples in order to concurrently obtain a set of N input samples x(t), x(t–1), . . . x(t–N+1) of different sampling times, where N is an integer greater than two, for multiplying each set of input samples by respective coefficients $w_0(t)$, $w_1(t)$, . . . $w_{N-1}(t)$, for adding together each set of multiplied input samples into a first sum $y_1(t)$, for computing a first difference signal $e_1(t)$ representative of a difference between the first sum $y_1(t)$ and the reference signal d(t), and for updating the coefficients for each new set of input samples on the bases of the input signal and the first difference signal and a first step gain $K_1$ which is fixed; and (d) a second filter subsystem for imparting a unit delay of one predetermined sampling interval to the successive input signal samples in order to concurrently obtain a set of M input samples $x(t), x(t-1), \ldots x(t-M+1)$ of different sampling times, where M is an integer greater than two, for multiplying each set of input samples by respective coefficients $w_0(t), w_1(t), \ldots w_{M-1}(t)$, for adding together each set of multiplied input samples into a second sum $y_2(t)$, for computing a second difference signal $e_2(t)$ representative of a difference between the second sum $y_2(t)$ and the reference signal $d(t)$, and for updating the coefficients for each new set of input samples on the bases of the input signal and the second difference signal and a second step gain $K_2(t)$ which is varied with time in response to the first and the second difference signals $e_1(t)$ and $e_2(t)$.

More specifically, the invention provides a method of computing the second step gain $K_2(t)$ for the second filter subsystem. The method comprises: (a) computing the mean value $\delta_{e1}'^2(t)$ of the first difference signal $e_1(t)$ over L input samples received until sampling time t, where L is an integer not less than two; (b) computing the mean value $\delta_{e2}'^2(t)$ of the second difference signal $e_2(t)$ over L input samples received until sampling so time t,(c) computing a first value $0.5\, \delta_{e1}'^2(t-N)$ by multiplying by 0.5 the mean value $\delta_{e1}'^2(t-N)$ of the first difference signal which has been computed as at step (a) at sampling time $(t-N)$ which is N predetermined sampling intervals before the time t;(d) computing a second value $\delta_n'^2(t)$ representative of a difference between the mean value $\delta_{e1}'^2(t)$ computed at step (a) and the first value $0.5\, \delta_{e1}'^2(t-N)$ computed at step (c);(e) judging whether or not the second value $\delta_n'^2(t)$ is equal to or greater than zero;(f) holding the second value $\delta_n'^2(t)$ as computed at step (d) if the second value proves to be equal to or greater than zero at step (e), and providing zero as the second value $\delta_n'^2(t)$ if the second value proves to be not equal to nor greater than zero at step (e);(g) computing a third value $\delta_{na}'(t)$ according to equation, $\delta_{na}'(t)=\alpha\delta_n'^2(t+(1-\alpha)\delta_{na}'^2(t-11)$, based on the second value $\delta_n'^2(t)$ as determined at step (f), where $\alpha$ is a parameter having a value ranging from zero to one, and $\delta_{na}'^2(t-1)$ is the third value one sampling interval before the sampling time t;(h) judging whether or not the mean value $\delta_{e1}'^2(t)$ of the first difference signal is equal to or less than the mean value $\delta_{e2}'^2(t)$ of the second difference signal;(i) judging whether or not the mean value $\delta_{e1}'^2(t)$ of the first difference signal is equal to or greater than the mean value $\delta_{e1}'^2(t-N)$ of the first difference signal at the time $(t-N)$;(j) providing one as the second step gain $K_2(t)$ when both conditions of steps (h) and (i) prove to be met; and (k) computing $[\delta_{e2}'^2(t) - \delta_{na}'^2(t)]/\delta_{e2}'^2(t)$ and providing the resulting value as the second step gain $K_2(t)$ when both conditions of steps (h) and (i) prove to be not met.

Why the above summarized method accomplishes the objectives of this invention may now be explained. The convergence of the NLMS algorithm can be defined by the following equation according to the article "Comparison of the Convergence of Two Algorithms for Adaptive FIR Digital Filters" by Theo A. C. M. Claasen et al. in the Volume ASSP-29, Number 3 issue of *IEEE Transactions on Acoustics, Speech, and Signal Processing* published in June 1981, provided that the input signal $x(t)$ is unrelated to the noise $n(t)$ which is normal white noise, and that there are a sufficiently large number of taps N:

$$\delta\epsilon^2(t+1)=[1- K(\,2-K)/N]\delta\epsilon^2(t)+(K^2/N)\delta_n^2(t) \qquad (6)$$

where $\delta\epsilon^2(t)$=mean value of the estimated noise-free difference signal, generally expressed as $E[\epsilon^2(t)]$ $\delta_n^2(t)$=mean value of noise, generally expressed as $E[n^2(t)]$.

Expression (6) proves that convergence occurs in the shortest time when the step gain K is one.

The mean value of the estimated difference signal after convergence is defined as $$\lim_{t\to\infty} \sigma_\epsilon^2(t) = [K/(2 - K)]\, \sigma_n^2(t). \qquad (7)$$

Substitute one for K in Expression (6). Then the mean value of the estimated difference signal of the first subsystem can be expressed as follows, provided that noise is constant, that the mean noise value $\delta_n^2(t)$ at time t is equal to the mean noise value $\delta_n^2(t-N)$ at time $(t-N)$, and that the mean value of the constant noise is $\delta_n^2$.

$$\delta\epsilon_1^2(t)- \delta\epsilon_1^2(t-1)=-[(1/N)\delta\epsilon_1^2(t-1)]+(1/N)\delta_n^2. \qquad (8)$$

From Expression (8) the difference between the mean value $\delta\epsilon_1^2(t)$ is of the estimated difference signal at time t and the mean value $\delta\epsilon_1^2(t-N)$ of the estimated difference signal N sampling intervals before is expressed as $$\delta\epsilon_1^2(t) - \delta\epsilon_1^2(t-N)=-(1/N)[\delta\epsilon_1^2(t-N)+\delta\epsilon_1^2(t-N+1)+\ldots +\delta\epsilon_1^2(t-1)]+\delta_n^2. \qquad (9)$$

Expression (9) holds true when the adaptive filter is in constant operation. Initially, when the filer is not in constant operation, the mean value of the estimated difference signal decreases by updating the coefficients, so that the right side of Expression (9) is given by $$(1/N)[\delta\epsilon_1^2(t-N) +\delta\epsilon_1^2(t-N+1)+\ldots +\delta\epsilon_1^2(t-1)]\geq\delta\epsilon_1^2(t) \qquad (10)$$

The left side of Expression (8) is expressed as $$\delta\epsilon_1^2(t)- \delta\epsilon_1^2(t-N)\leq - \delta\epsilon_1^2(t)+\delta_n^2. \qquad (11)$$

From Expression (6) the mean value of the difference signal $e_1(t)$ can be written as $\delta_{e1}^2(t)=\delta_{\epsilon1}^2(t)+\delta_n^2(t)$. Thus, since $\delta_{\epsilon1}^2(t)=\delta_{e1}^2(t) - \delta_n^2(t)$, the mean value of the noise during the initial state is, from Expression (11), $$2\, \delta_{e1}^2(t) - \delta_{e1}^2\, (t-N)\leq 2\, \delta n^2. \qquad (12)$$

The mean value of the difference signal becomes constant upon convergence of the first filter subsystem, so that both sides of Expression (10) become equal. The mean value of noise during the normal state is given by $$2\, \delta_{e1}^2(t) - \delta_{e1}^2(t-N)=2\, \delta_n^2. \qquad (13)$$

According to the invention the mean noise value is estimated according to the following equation based on Expressions (12) and (13):

$$\delta_n'^2(t)=\delta_{e1}^2(t) - 0.5\, \delta_{e1}^2(t-N). \qquad (14)$$

The following is a discussion of how the step gain $K_2(t)$ of the s second filter subsystem is determined by use of the mean noise value estimated according to Expression (14). If $$\delta_{e1}'^2(t)\leq\delta_{e2}'^2(t),\text{ and } \delta_{e1}'^2(t)\geq\delta_{e1}'^2(t-N), \qquad (15)$$

then $K_2(t)=1$. If the conditions of Expression (15) are not met, then $$K_2(t) = [\delta_{e2}'^2(t) - \delta_{na}'^2(t)]/\delta_{e2}'^2(t) \quad (16)$$

where $$\delta_{na}'^2(t) = \alpha \delta_n{}^2(t) + (1-\alpha)\delta_{na}'^2(t-1) \quad (17)$$

However, if the conditions $$\delta_{e1}'^2(t) - 0.5 \, \delta_{ea}'^2(t-N) \geq 0 \quad (18)$$

are not met, then $$\delta_{na}'^2(t) = 0.$$

If the conditions of Expression (18) are met, on the other hand, then $$\delta_{na}'^2(t) = \delta_{e1}'^2(t) - 0.5 \, \delta_{e1}'^2(t-N). \quad (19)$$

$\delta_{e1}'^2(t)$ and $\delta_{e2}'^2(t)$ are the mean values of the difference signals expressed respectively as $$\sigma_{e1}{}^2(t) = (1/L) \sum_{j=0}^{L-1} e_1{}^2(t-j)$$

and $$\sigma_{e2}{}^2(t) = (1/L) \sum_{j=0}^{L-1} e_2{}^2(t-j)$$

where

L=number of taps on the delay line such as shown at 42 in FIG. 4

α=parameter having a value from zero to one.

Expressions (16)–(19) prove that for the accomplishment of the objectives of the invention, whether the first filter subsystem for noise estimation has converged or not may first be determined from the current mean value $\delta_{e1}'^2(t)$ of the difference signal and the mean value $\delta_{e1}'^2(t-N)$ of the difference signal at time (t-N) which is N sampling intervals before. The step gain $K_2(t)$ of the second filter subsystem may be compulsorily fixed at one if the first subsystem has not yet converged. In this manner it is possible to prevent the conventionally encountered delay in convergence during the initial state and hence to attain higher speed convergence, with convergence errors comparable to those of the closest prior art.

The invention will be better understood from the following detailed description of a preferred embodiment taken together with the attached drawings.

BRIEF DESCRIPTION OF THE DRAWINGS

Figure 5:
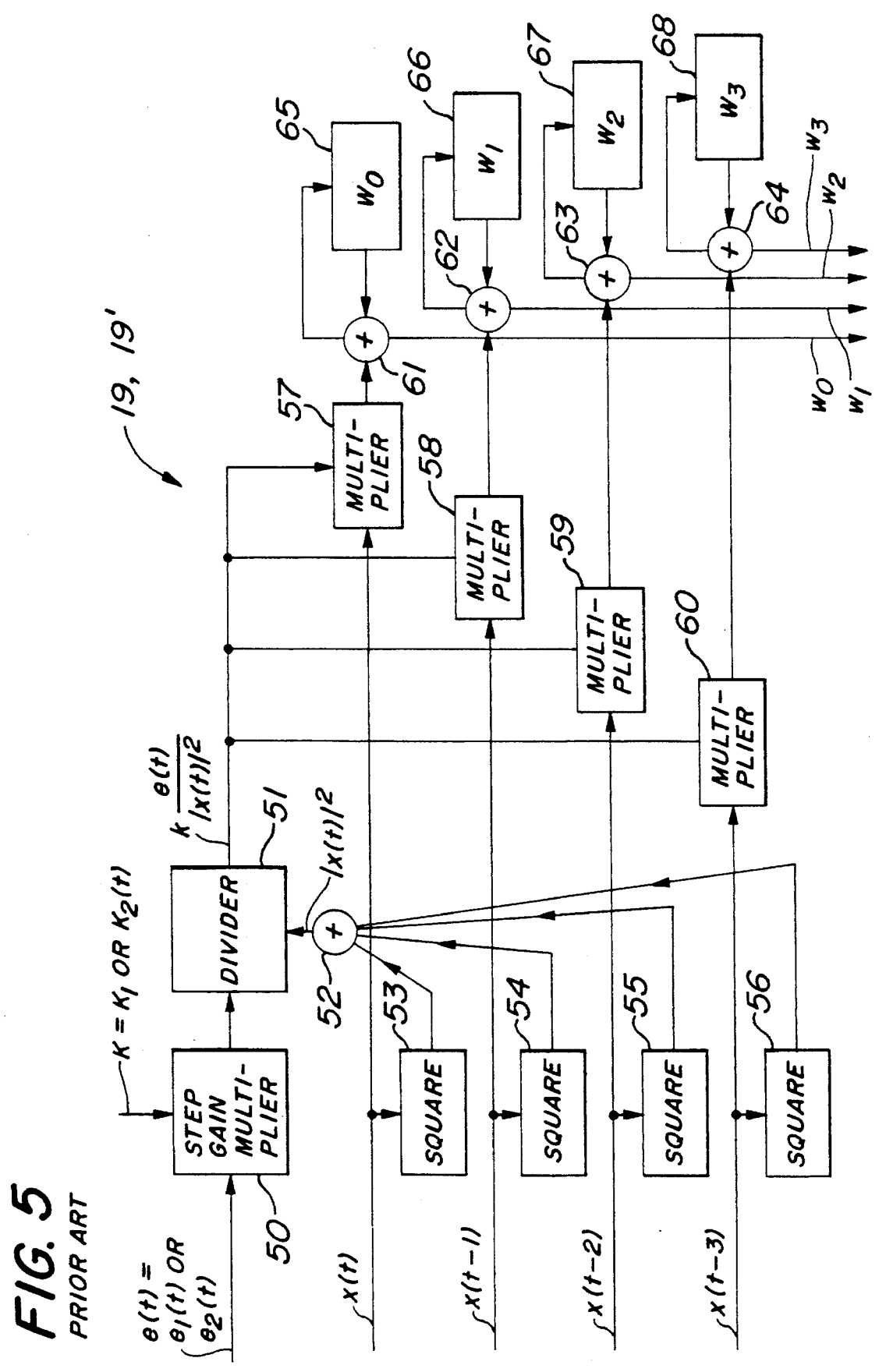

FIG. 5 is a block diagram of each of the two coefficient updaters of the FIG. 2 system;

FIG. 7 is a block gain of the step gain computer of the FIG. 6 system;

DETAILED DESCRIPTION

Figure 1:
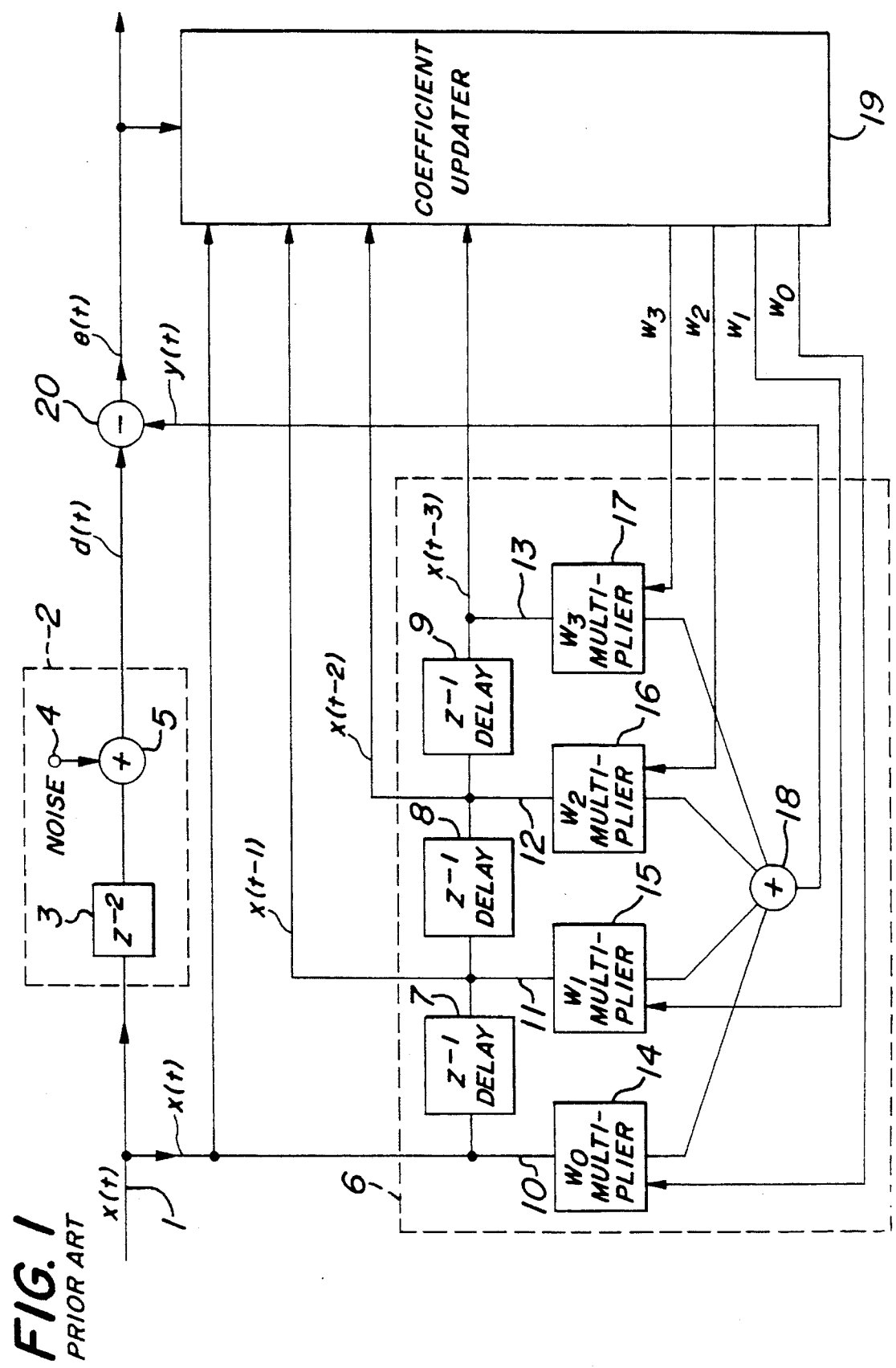
FIG. 1 is a block diagram of the prior art adaptive filter system based upon the NLMS algorithm.

A preferred form of duplex adaptive filter system according to the invention will now be described in detail with reference to FIG. 6. A comparison of this figure with FIG. 2 will indicate that the filter system according to the invention is substantially akin to the prior art duplex system, the only difference therebetween being the step gain computer which is designated 23a in FIG. 6 by way of distinction from its counterpart 23 in the FIG. 2 prior art system. All the other components of the filter system according to the invention are designated by the same reference characters as used to denote their counterparts of the FIG. 2 prior art system.

The two filter subsystems 21 and 21' of the filter system according to the invention are also each of substantially the same construction as in FIG. 1. Thus the first and second transversal filter units 6 and 6', both having N tap lines, provide the first output $y_1(t)$ and second output $y_2(t)$, respectively, and the first and second subtracters 20 and 20' 3 provide the first difference signal $e_1(t)=d(t)-y_1(t)$ and second difference signal $e_2(t)=d(t)-y_2(t)$, respectively.

The two coefficient updaters 19 and 19' compute the updated coefficients W(t+1) according to Expression (3), as has been set forth in connection with the coefficient updater 19 of the FIG. 1 prior art system. Such computations require the step gains K. According to the invention, the step gain $K_1$ of the first filter subsystem 21 is set at one or thereabout as in the FIG. 2 prior art system, but the step gain $K_2(t)$ of the second filter subsystem 21' is determined by the step gain computer 23a by a method different from that of FIG. 2 prior art system.

Figure 4:
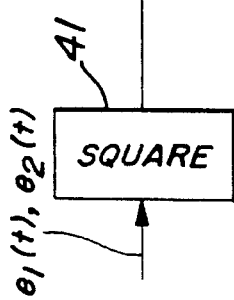
FIG. 4 is a block diagram of the means for computing the mean values of the difference signals in the FIG. 3 step gain computer.
Figure 7:
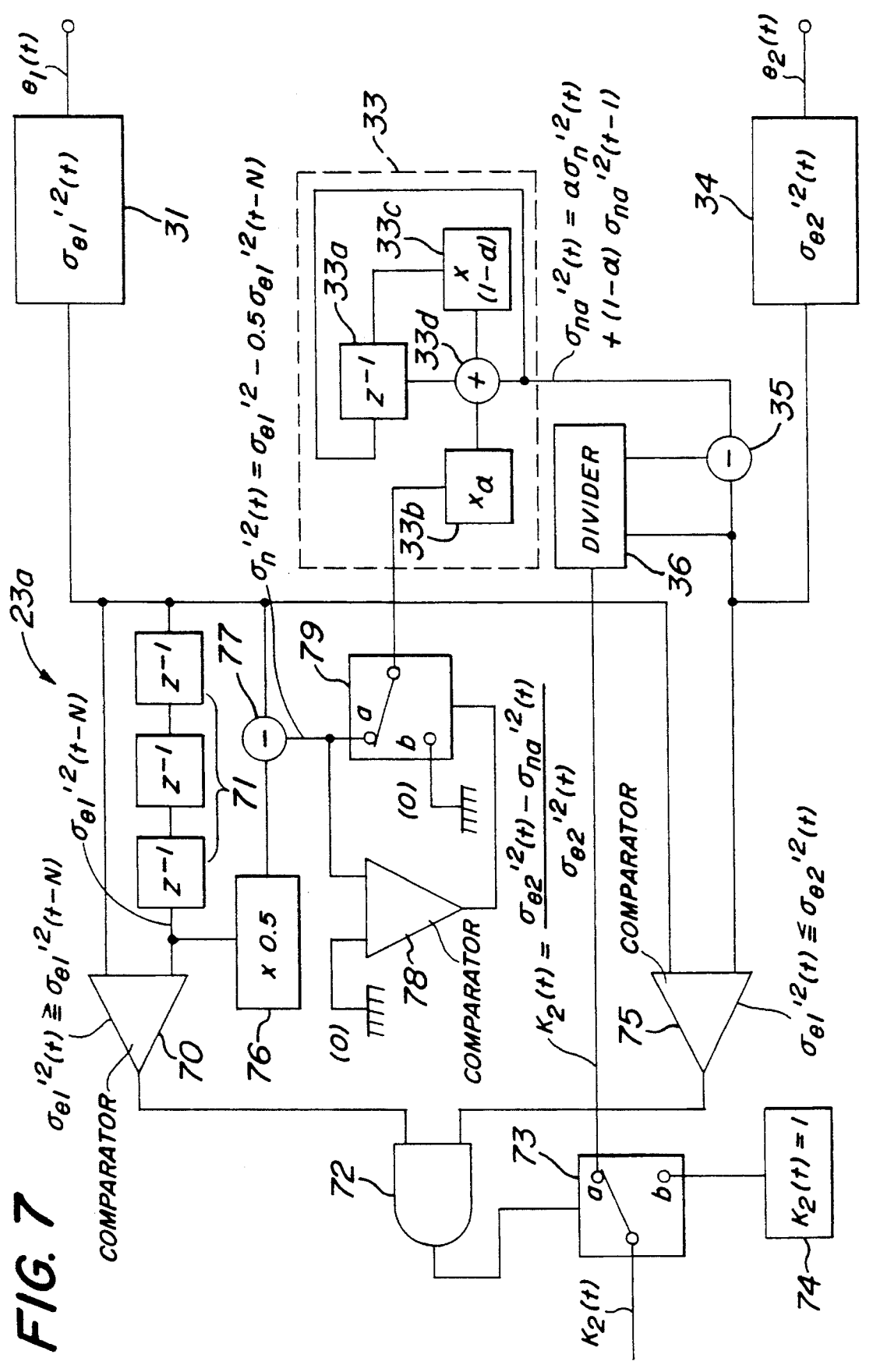

As functionally diagramed in detail in FIG. 7, the step gain computer 23a has means 31 for computing $\delta_{e1}'^2$ in response to the first difference signal $e_1(t)$ from the first subtracter 20, and means 34 for compuling $\delta_{e2}'^2(t)$ in response to the second difference signal $e_2(t)$ from the second subtracter 20'. Both means 31 and 34 are configured as shown in FIG. 4.

A comparator 70, which determines whether $\delta_{e1}'^2(t)$ is equal to or greater than $\delta_{e1}'^2(t-N)$ or not has a first input coupled directly to the means 31, and a second input coupled to the same means 31 via (N-1), three shown, delay elements 71. The output of the comparator 70 is coupled via an AND gate 72 to a step gain selector switch 73 which is shown to have two fixed contacts a and b. The switch contact a is coupled to a divider 36, and the other switch contact b to a circuit 74 which provides one as the step gain $K_2(t)$.

Another comparator 75 has its two inputs coupled to the means 31 and 34 in order to determine whether $\delta_{e1}'^2(t)$ is equal to or less than $\delta_{e2}'^2(t)$ or not. The output of the comparator 75 is coupled to the AND gate 72. Thus the AND gate 72 goes high when the two conditions set forth at Expression (15) are both met, causing the step gain selector switch 73 to select one as the step gain $K_2(t)$, otherwise, the selector switch 73 chooses the output from the divider 36 as the step gain.

The series of delay elements 71 is coupled not only to the comparator 70 but also to a multiplier 76 which computes the term, $0.5\, \delta_{e1}'^2(t-N)$, of Expression (18). The output of the multiplier 76 and that of the means 31 are both coupled to a subtracter 77 whereby the left side of Expression (18) is computed. The output of this subtracter is coupled to one input of still another comparator 78, another input of which is grounded for inputting a signal representative of zero. Thus the corporator 78 functions to determine if the conditions of Expression (18) are met.

The output from the comparator 78 is used to control a selector switch 79 which is shown to have a first fixed contact a coupled to the output of the subtracter 77, and a second fixed contact b which is grounded. The switch 79 puts out zero when the conditions of Expression (18) are met and, when they are not, the mean noise value $\delta_n'^2(t) = \delta_{e1}'^2(t) - 0.5\, \delta_{e1}'^2(t-N)$.

Figure 3:
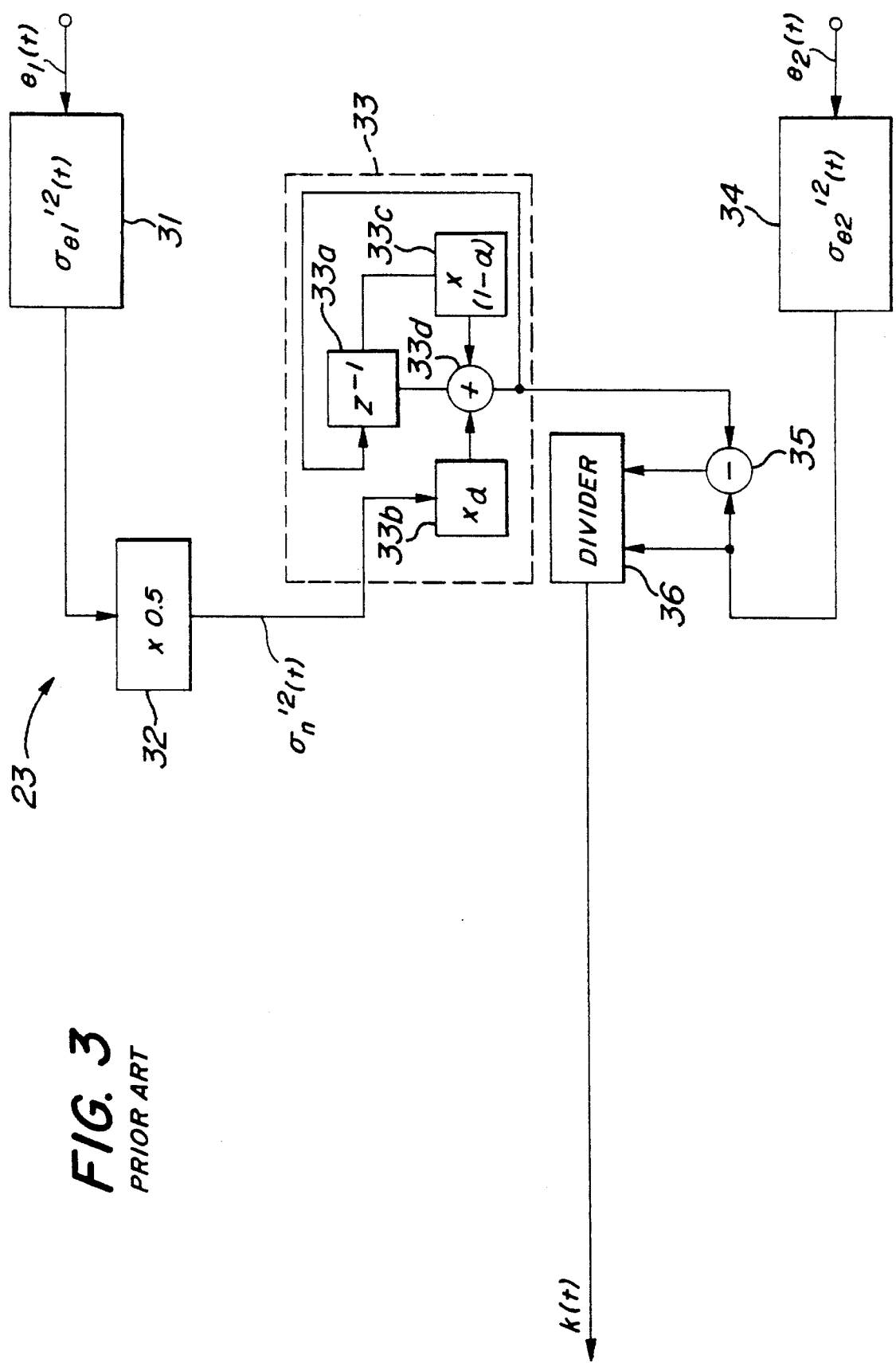
FIG. 3 is a block diagram of the step gain computer of the FIG. 2 system.

The output of the selector switch 79 is coupled to a lowpass filter 33 of the same construction as shown in FIG. 3. The lowpass filter 33 puts out a smoothed mean noise value $\delta_{na}'^2$ by making the computation $$\alpha\delta_n'^2(t) + 1 - \alpha)\delta_{na}'^2(t-1)$$

where $\alpha$ is a parameter having a value ranging from zero to one, and $\delta_{na}'^2(t-1)$ is the output from the lowpass filter 33 one sampling interval before.

A subtracter 35, shown also in FIG. 3, has its two inputs coupled to the filter circuit 33 and to the means 34 for computing the numerator of the right side of Expression 16. The output of the subtracter 35 is coupled to one input of a divider 36, which has another input coupled to the means 34. The divider 36 performs the computations of Expression (16) for providing the step gain $K_2(t)$.

Figure 6:
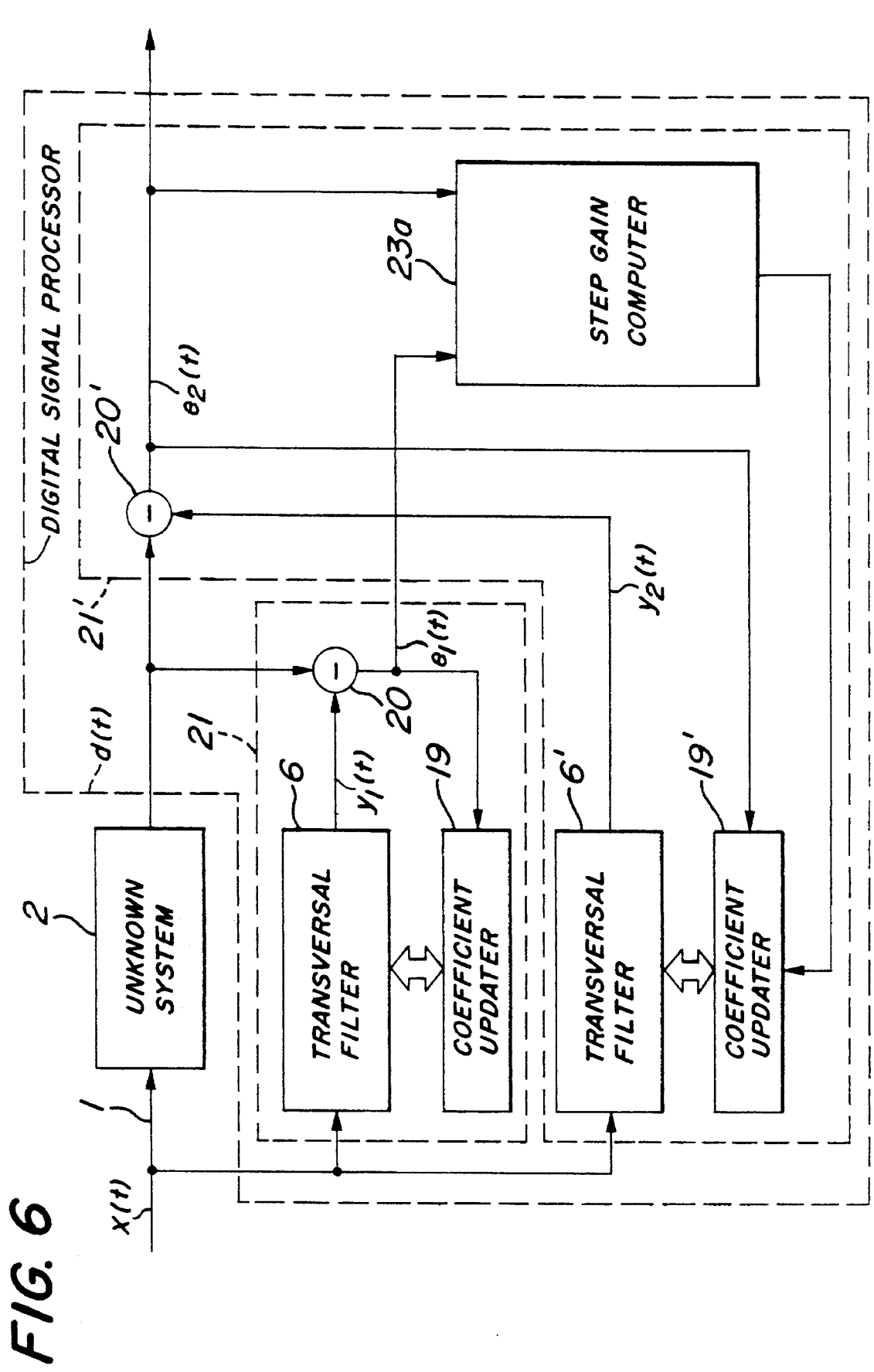
FIG. 6 is a block diagram of the duplex adaptive filter system according to the invention.
Figure 8A:
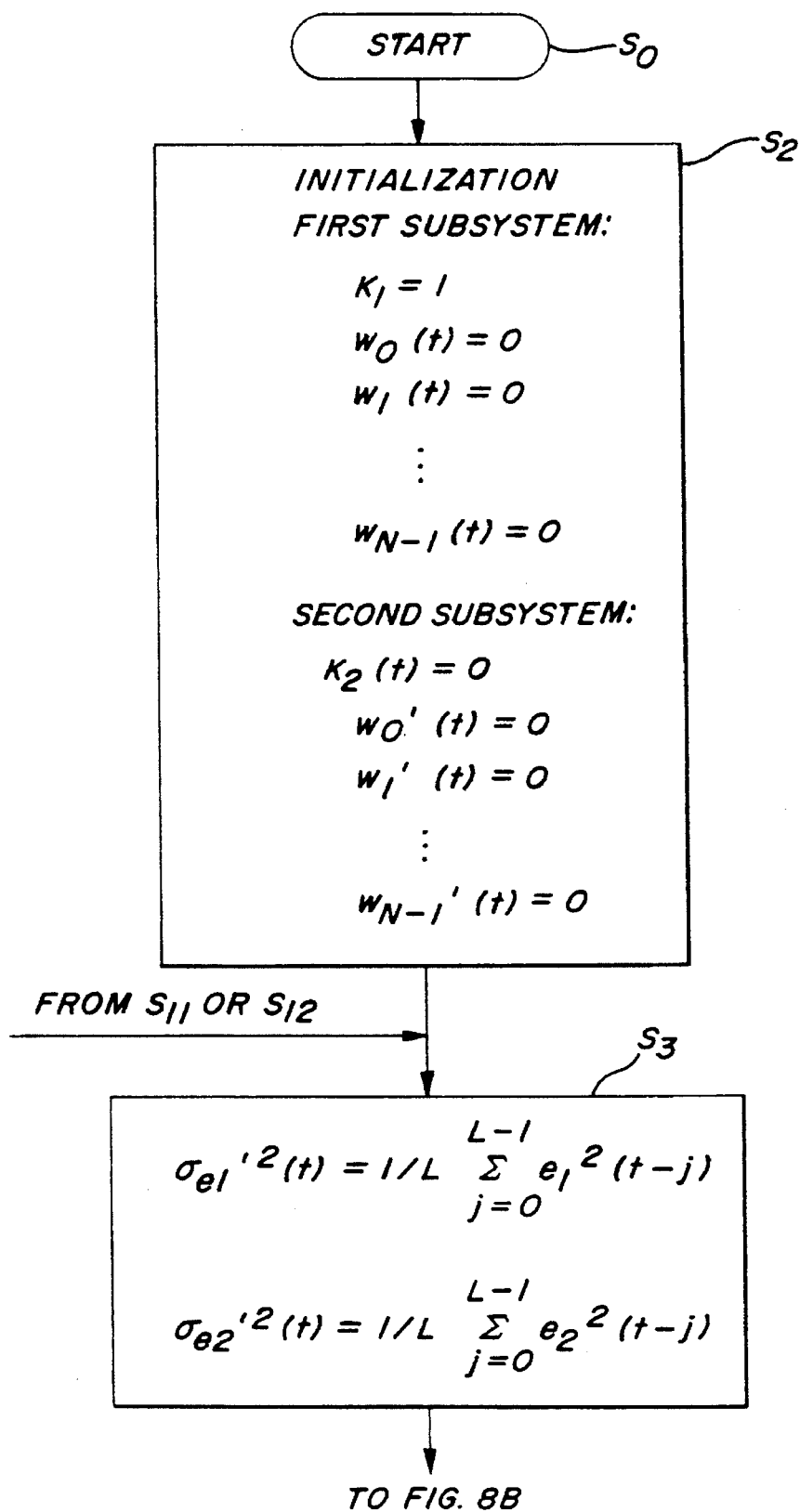
FIGS. 8A, 8B and 8C show in combination a flow chart of how the variable step gain of the FIG. 2 system is computed.
Figure 8B:
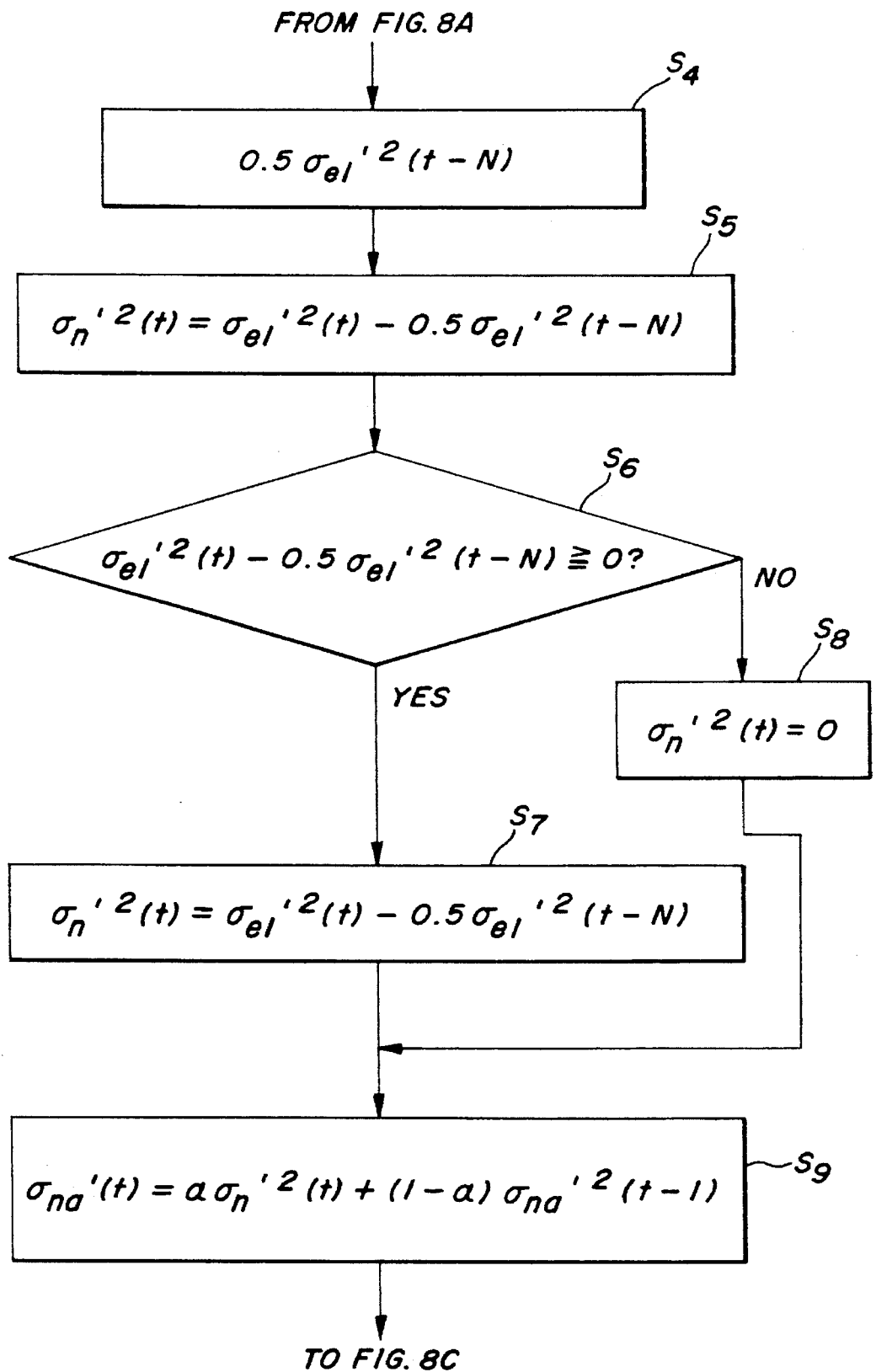
Figure 8C:
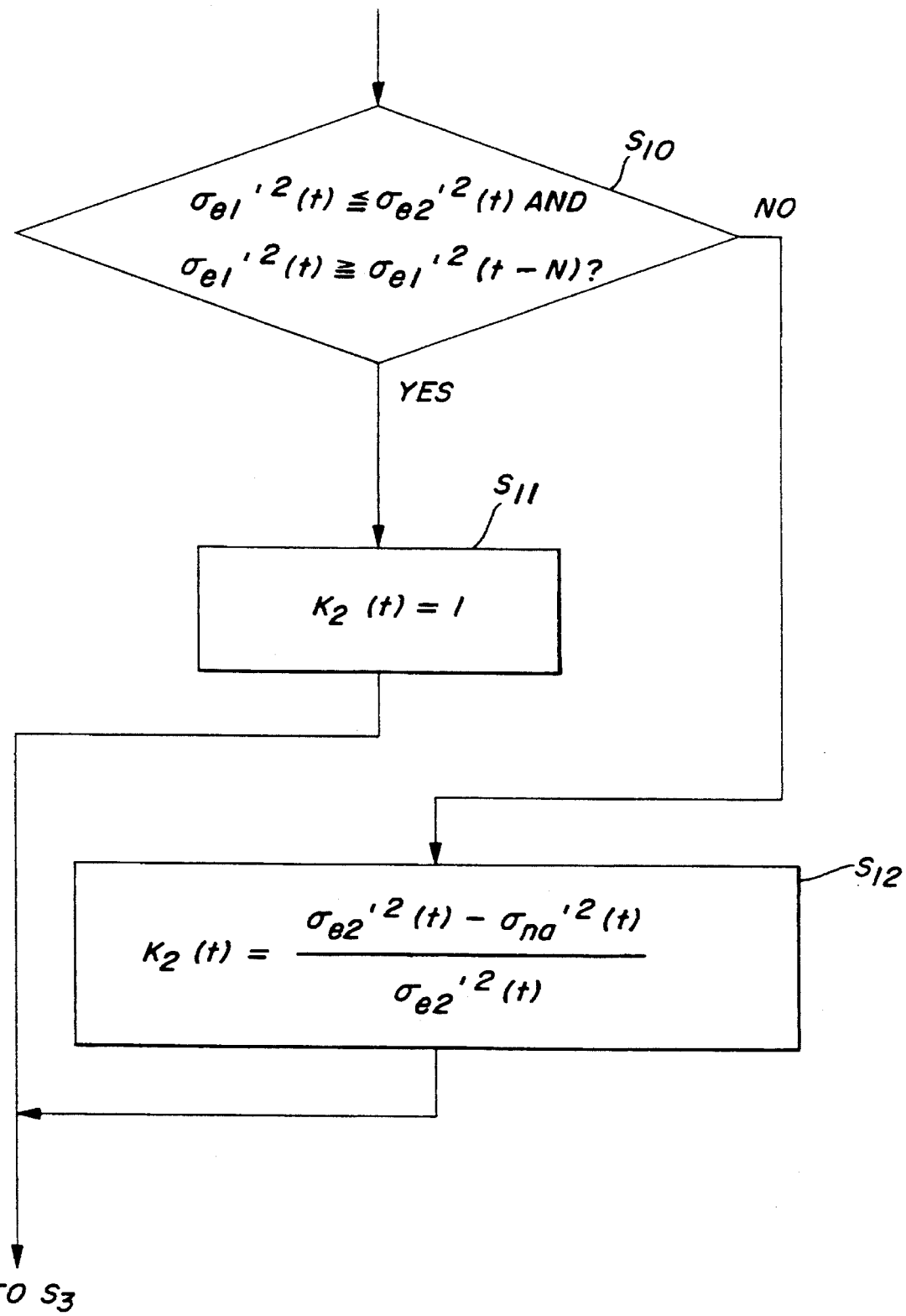

How the step gain computer 23a of the foregoing hardware computes and determines the step gain $K_2(t)$ for the second subsystem 21' of the FIG. 6 duplex filter system may be flowcharted as in FIGS. 8A–8C. As the step gain computation routine starts at $S_1$ in FIG. 8A, both sub-systems 21 and 21' are initialized at block $S_2$ by setting the first step gain $K_1$ at one, the second step gain $K_2(t)$ at zero, and the coefficients $W_0(t), W_1(t), \ldots W_{N-1}(t)$ and $W_o'(t), W_1'(t), \ldots W_{N-1}'(t)$ at zero.

Then, at block $S_3$, the mean values of the difference signals $e_1(t)$ and $e_2(t)$ of both subsystems 21 and 21' are computed according to the equations given in the block.

Then, at a block $S_4$ FIG. 8B, the mean value $\delta_{e1}'^2(t-N)$ of the first difference signal at time $(t-N)$, which precedes the time t by N sampling intervals, is computed by the same method as in block $S_3$. This mean value is then multiplied by 0.5.

Then, at a block $S_5$, there is computed the difference $\delta_n'^2(t)$ between the mean value $\delta_{e1}'^2(t)$ of the first difference signal at the time t, which has been computed at the block $S_3$, and the value, $0.5\, \delta_{e1}'^2(t-N)$, which has been computed at the block $S_4$.

Then comes a node $S_6$ in which it is determined whether or not the value computed at block $S_5$ is equal to or greater than zero. If it is, the mean noise value $\delta_n'^2(t)$ computed at the block $S_5$ is chosen, as at a block $S_7$. If it is not, then zero is chosen as the mean noise value, as at a block $S_8$.

Then, at a block $S_9$ the computation, $\delta_{na}' = \alpha\delta_n'^2(t) + (1-\alpha)_{na}'^2(t-1)$, is performed, as at the lowpass filter 33, FIG. 7.

Then comes another node $S_{10}$, FIG. 8C, which questions whether or a not the mean value $\delta_{e1}'^2(t)$ of the first difference signal is equal to or less than the mean value $\delta_{e2}'^2(t)$ of the second difference signal, and whether or not the mean value of the first difference signal is equal to or greater than the mean value $\delta_{e1}'^2(t-N)$ of the first difference signal at the time $(t-N)$.

The value one is chosen as the second step gain $K_2(t)$, as at block $S_{11}$, if both conditions of the node $S_{11}$ prove to be met. If not, on the other hand, then the division, $[\delta_{e2}'^2(t) - \delta_{na}'^2(t)]/\delta_{e2}'^2(t)$, is computed for the second step gain $K_2(t)$. Upon determination of the second step gain $K_2(t)$ at block $S_{11}$ or $S_{12}$, the routine returns to the block $S_3$, FIG. 8A, for the determination of the second step gain for the next set of samples.

Determined as above according to the invention, the second step gain $K_2(t)$ is supplied from the step gain computer 23a to the coefficient updater 19', FIG. 6, of the second subsystem 21'. The coefficient updater 19' makes the computations of Expression 3) for updating the coefficients used by the transversal filter unit 6'.

Figure 2:
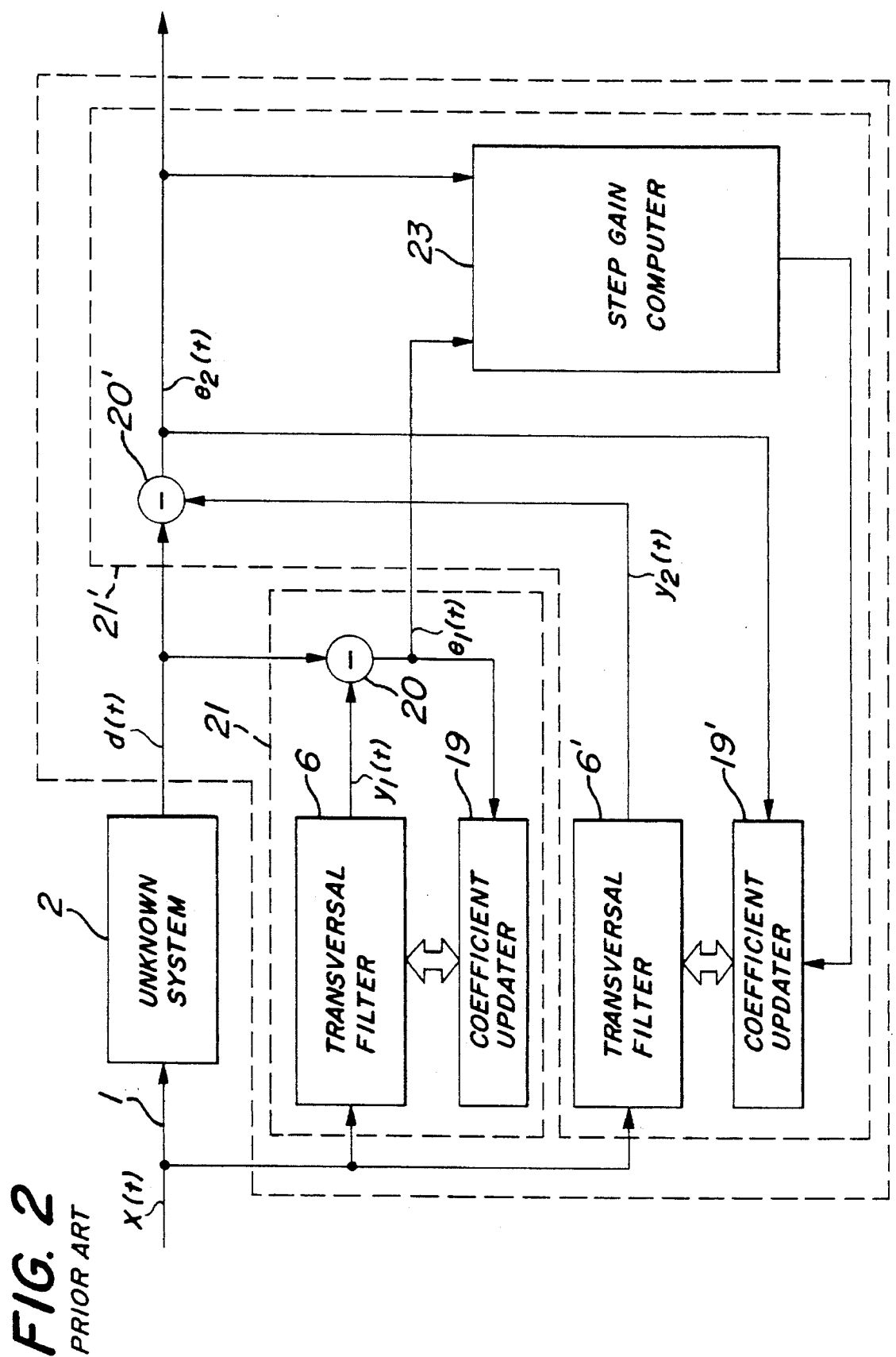
FIG. 2 is a block diagram of the prior art duplex adaptive filter system based upon the NLMS filter system of FIG. 1.

FIGS. 9–12 are graphic representations of computer simulations of the operation of the duplex adaptive filter system according to the invention as compared with that of the FIG. 2 prior art system. The curve A in each graph represents the invention, and the curve B the prior art. The simulations were made under the following conditions:

1. An FIR circuit similar to the FIG. 1 filter unit 6 was used as the unknown system 2, with a tap number of 1024.

2. Both filter units 6 and 6' had 1024 taps, and the coefficients were initially set at zero.

3. The tap number L in FIG. 4 was; 300, and the parameter $\alpha$ was 0.001.

4. Both $x(t)$ and $n(t)$ were white noise (average value zero).

5. Estimation error was computed by $$E(t) = (\|W(t) - H\|^2)/\|H\|^2$$

where H is the filter coefficients of the unknown system 2, given in place of the coefficients W of the FIG. 1 filter unit 6.

Figure 9:
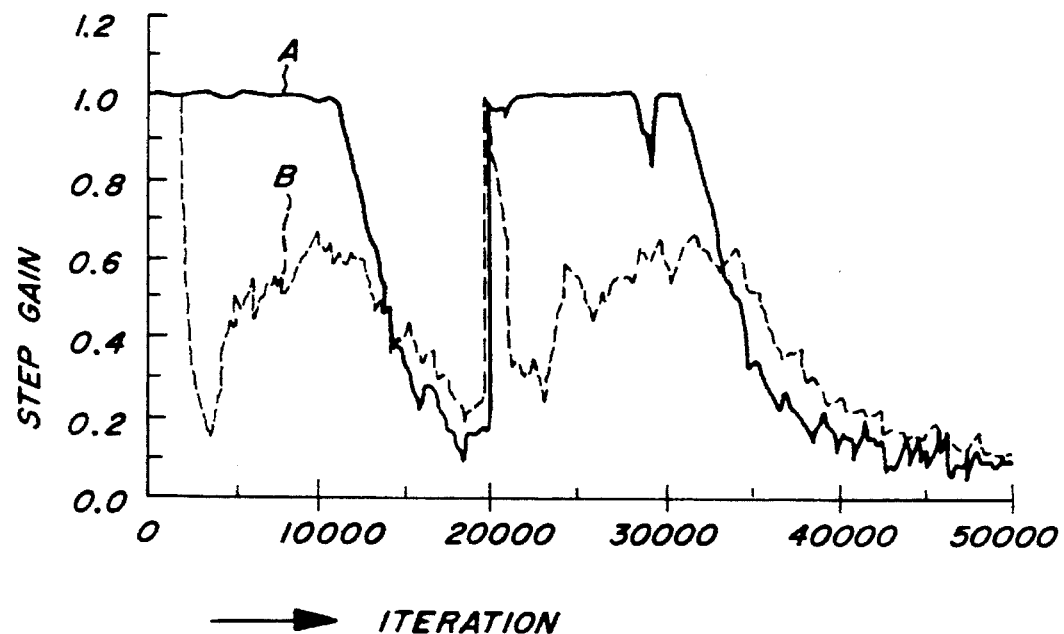
FIG. 9 is a graph plotting the curves of the variable step gains of the FIG. 6 inventive system and the FIG. 2 prior art system against the number of times the coefficients are updated.
Figure 10:
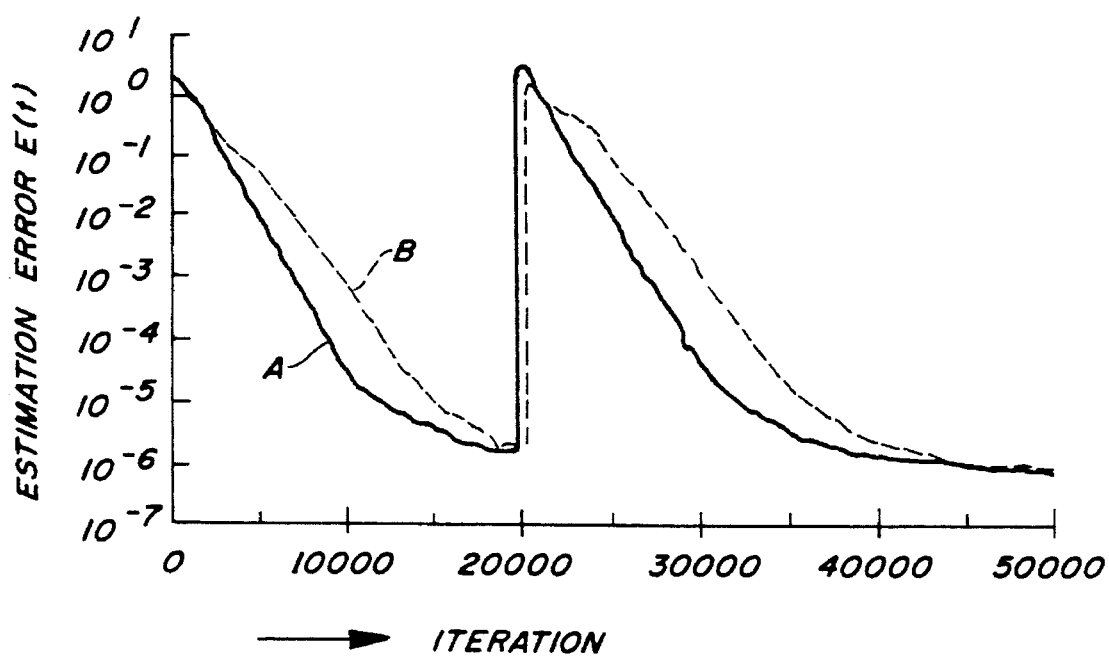
FIG. 10 is a graph plotting the curves of the estimation errors of the inventive and prior art systems against the number of times the coefficients are updated.
Figure 11:
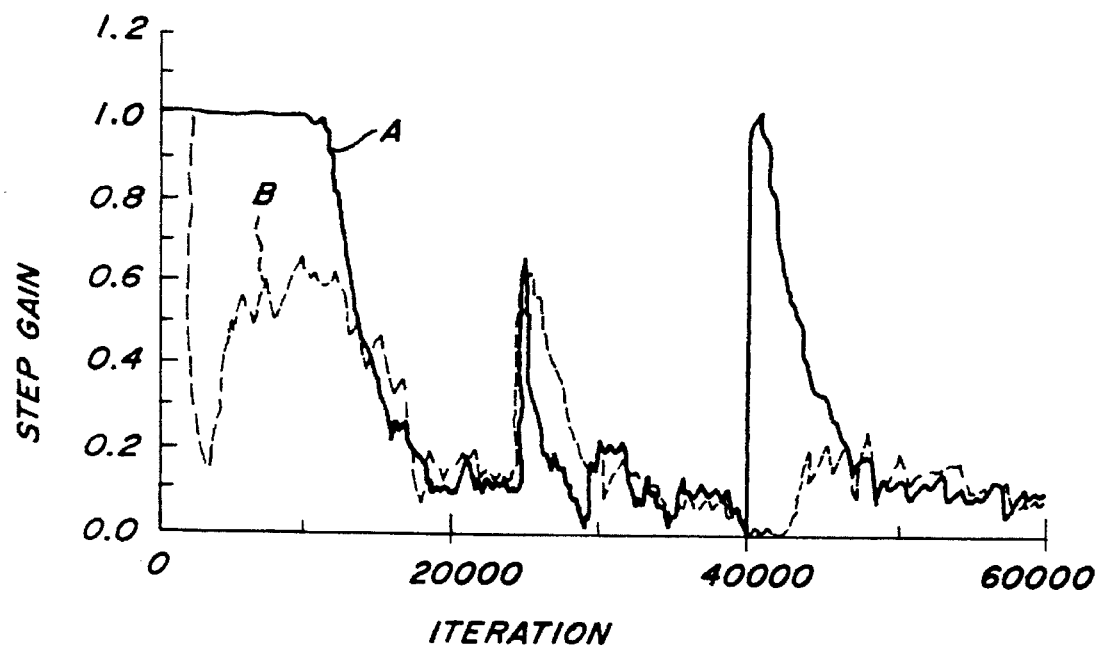
FIG. 11 is a graph similar to FIG. 9 except that the step gains were measured under different operating conditions.
Figure 12:
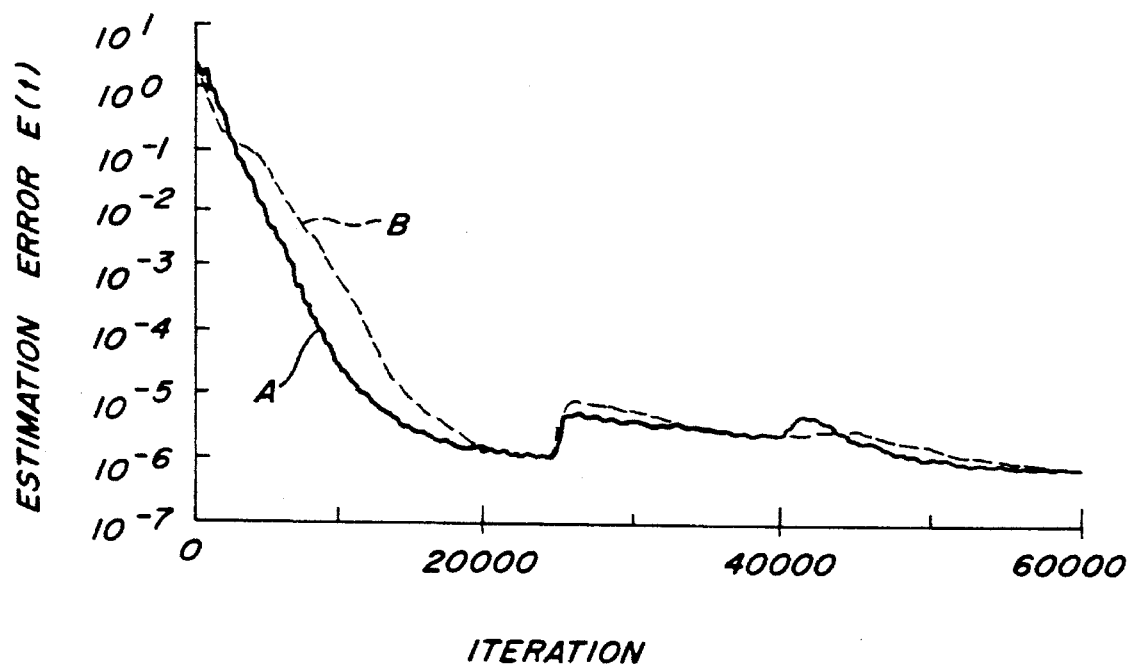
FIG. 12 is a graph similar to FIG. 10 except that the estimation errors were measured under different operating conditions.

FIGS. 9 and 10 show the convergence characteristics with the mean noise value set at 0.1, and with the sign of H inverted at the 20,000th updating. FIGS. 11 and 12 show similar characteristics with the mean noise value changed from 0.1 to 0.4 at 25,000th updating, and from 0.4 back to 0.1 at 40,000th updating. It will be appreciated that the convergence characteristics of this invention are remarkably better than those of the prior art.

Figure 13:
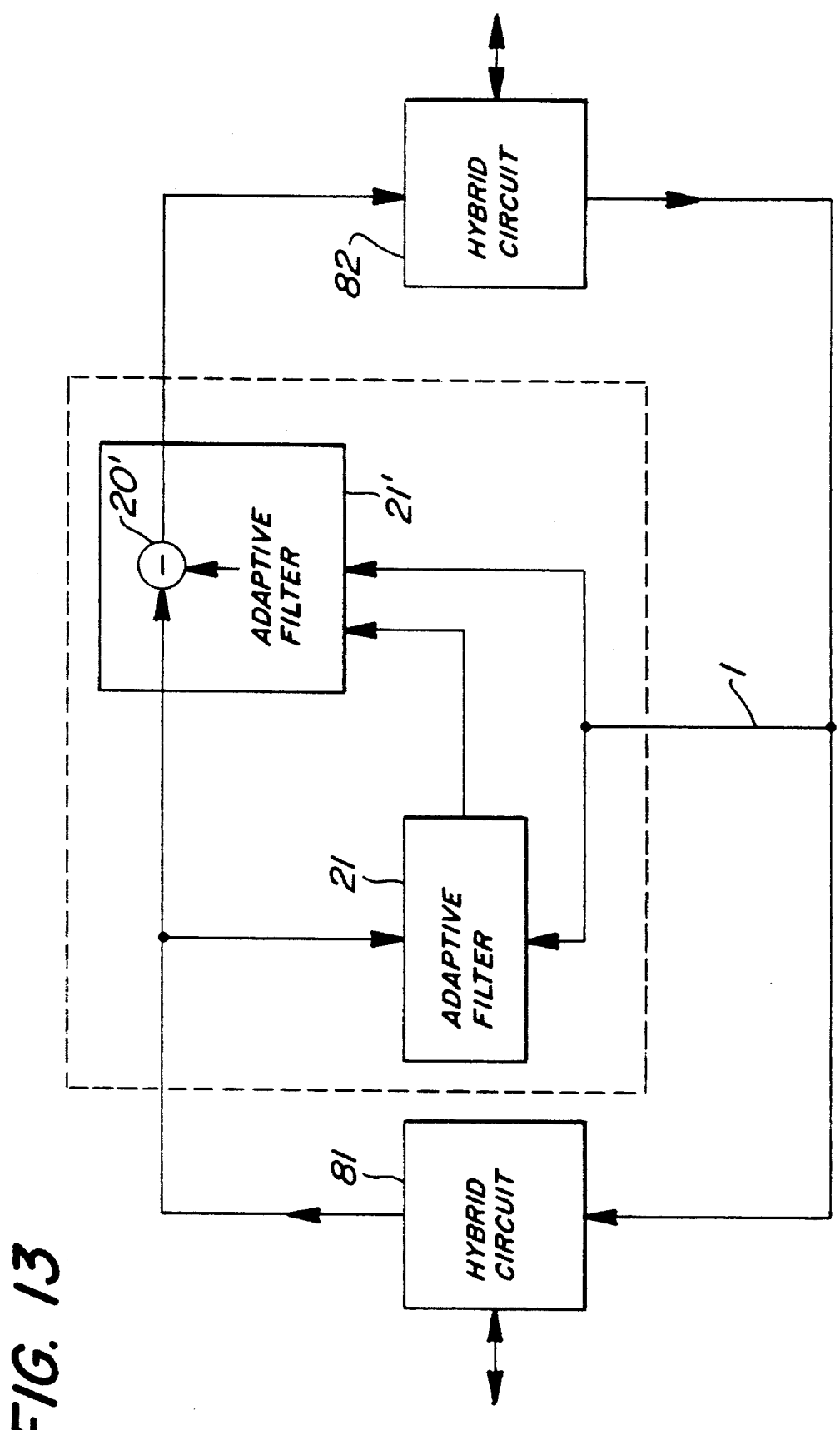
FIG. 13 is a block diagram explanatory of one possible practical application of the invention.

FIG. 13 is explanatory of one possible application of this invention. Connected between telephony hybrid circuits 81 and 82, the duplex filter system comprising the two subsystems 21 and 22' serves for echo cancellation.

Despite the foregoing detailed disclosure, it is not desired that the invention be limited by the exact showing of the drawings or the description thereof. The following, then, is a brief list of the possible modifications, alterations and adaptations of this invention which are all believed to fall within the scope of the appended claims:

1. The whole adaptive filter system might not necessarily be a digital signal processor but might be a combination of different electronic circuits.

2. The delay elements 7–9, FIG. 1, could be replaced by memories or by shift registers.

3. The delay line 42, FIG. 4, could be shared by both subsystems 21 and 21' by time division multiplexing.

4. The step gain of the first subsystem 21 could be set anywhere between 0.5 and 1.0, although 1.0 is preferred.

8. Some steps of the FIGS. 8A–8C flowchart are interchangeable in terms of time.

What is claimed is:

1. A step gain circuit for providing rapid conversion while minimizing error convergence in an adaptive filter system having a step gain, the adaptive filter system being coupled to at least one system, the system being provided with an input signal and generating a reference signal therefrom, wherein the adaptive filter system comprises:

a first filter subsystem for receiving the input signal and the reference signal and for generating from the input signal and the reference signal, a first difference signal having an error component and a noise component;

a second filter subsystem for receiving the input signal and the reference signal and for generating from the input signal and the reference signal a second difference signal having an error component and a noise component;

the step gain circuit being a component of the second filter subsystem and comprising:

a first averaging means for averaging the first difference signal and providing an output defining a first average difference signal;

a delay means coupled to the first averaging means for delaying the first average difference signal to provide an output defining a delayed first average difference signal;

a first comparison means for determining whether the delayed first average difference signal is less than the first average difference signal and for generating an output signal indicative of the determination;

a second averaging means for averaging the second difference signal and providing an output defining a second average difference signal;

a second comparison means for determining whether the second average difference signal is greater than the first average difference signal and for generating an output signal indicative of the determination;

a third comparison means coupled to receive the output signals from the first comparison means and the second comparison means and for determining based on those output signals if the delayed first average difference signal is less than the first average difference signal and the second average difference signal is greater than the .first average difference signal, and if so, generating an output signal defining a constant switch signal, and if not, generating an output signal defining a variable switch signal; and a step gain selector switching means coupled to the third comparison means for selecting between a constant step gain and a variable step gain based on the output signal generated by the third comparison means.

2. The step gain circuit of claim 1, wherein the step gain selector switch selects the constant step gain in response to the constant step switch signal and selects the variable step gain in response to the variable switch signal.

3. The step gain circuit of claim 2, further comprising:

a noise estimation means coupled to the first averaging means and the first delay means for generating a noise estimation signal based on the first average difference signal and the delayed first average difference signal;

a fourth comparison means coupled to the noise estimation means for determining if the noise estimation signal is positive;

a low pass filter means coupled to receive the noise estimation signal if it is positive for filtering the noise estimation signal to generate a filtered noise signal; and a step gain generator circuit means coupled to receive the filtered noise signal and the second average difference signal for generating a variable step gain signal by generating the difference between the second average difference signal and the filtered noise signal and dividing that difference by the second average difference signal, wherein the variable step gain signal is output from the step gain generator circuit means to the step gain selector switching means to provide the variable step gain when so selected.

4. The step gain circuit of claim 1, wherein the at least one system include a first telephony hybrid circuit and a second telephony hybrid circuit with the adaptive filter system coupled therebetween, the adaptive filter system comprising the step gain circuit providing echo cancellation for signals transmitted from the first telephony hybrid circuit to the second telephony hybrid circuit through the adaptive filter system.

5. The step gain circuit of claim 1, wherein the step gain circuit is implemented in a digital signal processor.

6. A method of generating a variable step gain in an adaptive filter system providing rapid convergence and minimal convergence error, the adaptive filter system being coupled to at least one system, the system being provided with an input signal and generating a reference signal therefrom, the adaptive filter system comprises:

a first filter subsystem for receiving the input signal and the reference signal and for generating from the input signal and the reference signal, a first difference signal having an error component and a noise component;

a second filter subsystem for receiving the input signal and the reference signal and for generating from the input signal and the reference signal a second difference signal having an error component and a noise component;

the method comprising the steps of:

averaging the first difference signal and defining the same as a first average difference signal;

delaying the first average difference signal and defining the same as a delayed first average difference signal;

determining whether the delayed first average difference signal is less than the first average difference signal and generating an output signal indicative of the determination;

averaging the second difference signal and defining the same as a second average difference signal;

determining whether the second average difference signal is greater than the first average difference signal and generating an output signal indicative of the determination;

determining based on those output signals if the delayed first average difference signal is less than the first average difference signal and the second average difference signal is greater than the first average difference signal, and if so, generating an output signal defining a constant switch signal, and if not, generating an output signal defining a variable switch signal;

selecting a constant-generated step gain in response to the constant switch signal; and selected a variable-generated step gain in response to the variable switch signal.

7. The method of claim 6, further comprising the steps of:

generating a noise estimation signal based on the first average difference signal and the delayed first average difference signal;

determining if the noise estimation signal is positive;

filtering the noise estimation signal if positive to generate a filtered noise signal;

generating a variable step gain signal by generating the difference between the second average difference signal and the filtered noise signal and dividing that difference by the second average difference signal, wherein the variable step gain signal serves as the variable-generated step gain.

* * * * *